United States Patent
Ikeda et al.

(10) Patent No.: US 8,486,334 B2
(45) Date of Patent: Jul. 16, 2013

(54) MAGNETIC SENSOR

(75) Inventors: Takashi Ikeda, Yokohama (JP);
Kazuhiro Ban, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 1550 days.

(21) Appl. No.: 11/791,491

(22) PCT Filed: Jan. 30, 2006

(86) PCT No.: PCT/JP2006/001905
§ 371 (c)(1),
(2), (4) Date: May 24, 2007

(87) PCT Pub. No.: WO2006/080571
PCT Pub. Date: Aug. 3, 2006

(65) Prior Publication Data
US 2007/0290683 A1 Dec. 20, 2007

(30) Foreign Application Priority Data

Jan. 31, 2005 (JP) ................................. 2005-023519

(51) Int. Cl.
*G01N 1/26* (2006.01)
*G01V 3/00* (2006.01)

(52) U.S. Cl.
USPC .............. 422/50; 324/252; 324/260

(58) Field of Classification Search
USPC .................... 422/50; 324/252, 260
See application file for complete search history.

(56) References Cited

U.S. PATENT DOCUMENTS

| 4,444,879 | A | * | 4/1984 | Foster et al. ................. 435/7.95 |
| 4,926,471 | A | | 5/1990 | Ikeda |
| 4,978,938 | A | | 12/1990 | Partin et al. ..................... 338/32 |
| 5,448,153 | A | | 9/1995 | Ikeda et al. |
| 5,565,757 | A | | 10/1996 | Ikeda et al. |
| 5,574,279 | A | | 11/1996 | Ikeda et al. |
| 5,923,637 | A | | 7/1999 | Shimada et al. |
| 6,219,275 | B1 | | 4/2001 | Nishimura ..................... 365/173 |
| 7,031,186 | B2 | | 4/2006 | Kang et al. ..................... 365/173 |
| 7,221,583 | B2 | | 5/2007 | Ikeda |

(Continued)

FOREIGN PATENT DOCUMENTS

JP 2-194576 8/1990
JP 8-15398 1/1996

(Continued)

OTHER PUBLICATIONS

D.L. Graham, et al., Biosensors & Bioelectronics "High sensitivity detection of molecular recognition using magnetically labelled biomolecules and magnetoresistive sensors" vol. 18, pp. 483-488 (2003).

(Continued)

*Primary Examiner* — Mark Shibuya
*Assistant Examiner* — Pensee Do
(74) *Attorney, Agent, or Firm* — Fitzpatrick, Cella, Harper & Scinto

(57) ABSTRACT

The invention is to provide a magnetic sensor capable of detecting magnetic particles over a wide range of number and of suppressing an increase in a detection area. The magnetic sensor includes a detection part, a selecting device connected electrically to an end of the detecting part, and a sensing amplifier for receiving a signal from the detecting part, wherein the detecting part includes at least two magnetoresistive films serially connected.

10 Claims, 4 Drawing Sheets

U.S. PATENT DOCUMENTS

| | | | |
|---|---|---|---|
| 2002/0086182 A1 | 7/2002 | Fujikata et al. | 428/692 |
| 2005/0100930 A1* | 5/2005 | Wang et al. | 435/6 |
| 2005/0106758 A1 | 5/2005 | Fukumoto et al. | 436/526 |
| 2006/0139817 A1 | 6/2006 | Inomata et al. | 360/324.12 |
| 2006/0226832 A1 | 10/2006 | Ikeda et al. | |
| 2007/0290683 A1 | 12/2007 | Ikeda et al. | |

FOREIGN PATENT DOCUMENTS

| | | |
|---|---|---|
| JP | 2682630 | 11/1997 |
| JP | 2698642 | 1/1998 |
| JP | 11-112054 | 4/1999 |
| JP | 11-213650 | 8/1999 |
| JP | 2002-204002 | 7/2002 |
| JP | 2004-205495 | 7/2004 |
| JP | 2004-289100 | 10/2004 |
| WO | 03/054523 | 7/2003 |
| WO | 03/067258 | 8/2003 |

OTHER PUBLICATIONS

G. Li, et al., Journal of Applied Physics, "Detection of single micron-sized magnetic bead and magnetic nanoparticles using spin valve sensors for biological applications" vol. 93, No. 10, pp. 7557-7559 (2003).

PCT International Search Report in corresponding International Application No. PCT/JP2006/301905, dated May 16, 2006.

Written Opinion of the International Searching Authority in corresponding International Application No. PCT/JP2006/301905, dated May 16, 2006.

\* cited by examiner

FIG. 6
| Pt |
| NiFe |
| FeCo |
| Al2O3 |
| FeCo |
| MnIr |
FIG. 7
| Pt |
| GdFeCo |
| FeCo |
| Al2O3 |
| FeCo |
| TbFeCo |
FIG. 8
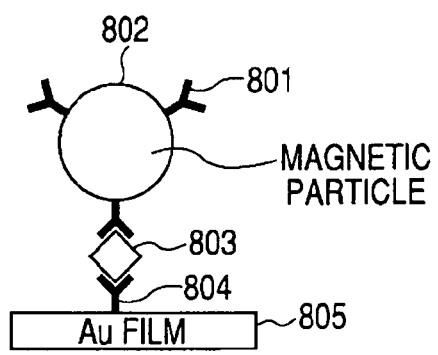
FIG. 9
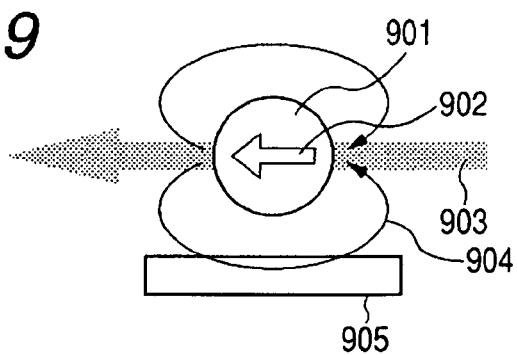

MAGNETIC SENSOR

TECHNICAL FIELD

The present invention relates to a sensor for detecting a magnetic material, and a biosensor utilizing such magnetic sensor.

BACKGROUND ART

For immunoassay, various methods have been proposed and practiced such as an radioactive immunoassay, and an enzyme antibody method. For example a radio immunoassy (RIA) or immunoradiometric assay (IRMA) utilizes a marking of a competitive antigen or an antibody with a radioactive nucleus and quantitatively determines the antigen by a measurement of specific radioactivity. This method is advantageous in a high sensitivity, but is associated with the safety of the radioactive nuclei and necessitates a facility and apparatuses exclusive for the assay. Also the anzyme antibody method utilizing an enzyme for the antibody marking is easier in handling in comparison with the radioactive immunoassay and has a practical sensitivity, but further improvements in the sensitivity and in the easy of handling are being desired.

On the other hand, a method of utilizing a magnetoresistive film for detecting a magnetic particle coupled with a target substance thereby easily detecting the target substance is proposed by D. L. Graham et al., Biosensors & Bioelectronics 18, 483(2003) (reference 1). The reference 1 utilizes two GMR (giant magnetic resistance effect) film of a size of 2×6 μm for detecting a magnetic particle of a diameter of 2 μm. Biotin is bonded to the surface of a GMR film for enabling fixation of the magnetic particle, but is not bonded to the other GMR film. Also the magnetic particle is modified with avidin.

Since avidin and biotin are bonded very strongly, the magnetic particle is fixed on a GMR film but not on the other. The GMR film on which the magnetic particle is influenced by a floating magnetic field from the magnetic particle, and shows a resistance different from that of the GMR film on which the magnetic particle is not fixed. The GMR film is basically constituted of a multi-layered film structure including two magnetic films and a non-magnetic metal film positioned therebetween. Its resistance depends on the relative directions of magnetization of the two magnetic films, and is relatively small when the directions of magnetization are parallel but relatively large when the directions of magnetization are antiparallel. In order to realize magnetizations of parallel and antiparallel, one of the two magnetic films constituting the GMR film is fixed in the direction of magnetization, while the other is formed by a magnetic material of a coercive force capable of a magnetic inversion by the floating magnetic field from the magnetic particle.

When a magnetic field is applied to the magnetic particle and the GMR film in a longitudinal direction thereof, thereby directing the magnetization of the magnetic particle in a direction of the applied magnetic field, a floating magnetic field 904 generated from the magnetic particle 1001 is, as shown in FIG. 9, applied to the GMR film 905 in a direction opposite to that of the external magnetic field 903. Therefore, magnetizations 902 by the two magnetic films of the GMR film 905 do not become parallel in the vicinity of the magnetic particle 901. On the other hand, the magnetic films of the GMR film 905 on which the magnetic particle is not fixed, not being influenced by the floating magnetic field 904, show parallel magnetizations over the entire film. Thus the two GMR film 905 shows different states of magnetization, thereby generating a difference in the resistance and enabling detection of the magnetic particle.

As described above, the method of detecting the magnetic particle with the GMR film is based on magnetizing the magnetic particle in a desired direction and changing the direction of magnetization of the magnetoresistive film by the floating magnetic field generated from the magnetic particle, and can easily detect the magnetic particle.

Also G. Li et al., J. Appl. Phys. 93, 7557(2003) (reference 2) discloses a sensor prepared by forming a GMR film capable of fixing a magnetic particle and a GMR film incapable of fixing a magnetic particle on a silicon wafer, and constructing a Wheatstone bridge with these GMR films and two other resistors, in which a detection signal of a magnetic particle is supplied through a sensing amplifier to a locking amplifier.

The reference 1 describes that a detection signal of the magnetic particles utilizing a single GMR film varies depending on the number of magnetic particles. This is because an area of the GMR film influenced by the floating magnetic field from the magnetic particles varies by the number of the magnetic particles. In case the area influenced by the floating magnetic field from the magnetic particles represents a very small ratio with respect to the entire area of the GMR film, the detection signal becomes very weak, whereby the magnetic particles become undetectable. According to the reference 1, for a detection current of 8 mA, a detection of a magnetic particle of a diameter of 2 μm with a GMR film of 2×6 μm provides a detection signal of 400 μV or less, whereby the two GMR films provides a resistance difference of 0.05Ω or less. As will be apparent from these experimental results, a GMR film can only detect one to several magnetic particles at maximum. Therefore the detection system described in reference 1 is incapable of detecting the magnetic particles over a wide range.

The reference 2 discloses a configuration in which plural GMR films are connected in parallel, of which a half is covered by a photoresist film and is therefore incapable of fixing the magnetic particles on the surface. Such configuration, though capable of detecting the magnetic particles over a wide range, is associated with a drawback that wirings and, peripheral circuits require a large area. It also involves a drawback that the GMR films cannot be arranged densely because of a complicated wiring arrangement, thereby increasing the entire detection area.

DISCLOSURE OF THE INVENTION

In consideration of the foregoing, an object of the present invention is to provide a magnetic sensor capable of detecting magnetic particles over a wide range and suppressing an increase in the detection area.

The present invention provides a magnetic sensor for detecting a magnetic particle with a magnetoresistive film, including a detection element in which plural magnetoresistive films are connected serially, a selecting transistor connected to the detection element, and a sensing amplifier.

More specifically, the magnetic sensor of the present invention includes plural detection parts, a selecting device connected to an end of the plural detection parts, and a sensing amplifier for receiving a signal from the detection parts, wherein each of the detection parts includes at least two magnetoresistive films electrically connected in series.

A sensor of the present invention utilizes any one of the aforementioned magnetic sensors and detects a target substance which fixed, in a desired position, a magnetic material to be detected by the magnetic sensor.

A detection kit of the present invention includes an aforementioned sensor, and a magnetic material bearing a substance capable of selectively bonding with a target substance.

Other features and advantages of the present invention will be apparent from the following description taken in conjunction with the accompanying drawings, in which like reference characters designate the same or similar parts through the figures thereof.

BRIEF DESCRIPTION OF THE DRAWINGS

FIG. 6 is a schematic view showing a film structure of a magnetoresistive film employed in the magnetic sensor of the embodiment 1 of the present invention.

FIG. 7 is a schematic view showing a film structure of a magnetoresistive film employed in the magnetic sensor of an embodiment 2 of the present invention.

FIG. 8 is a schematic view showing a mode of fixation of a magnetic particle in a biosensor in an embodiment 3 of the present invention.

FIG. 9 is a schematic view showing a direction of a floating magnetic field generated from a magnetic particle.

Figure 1:
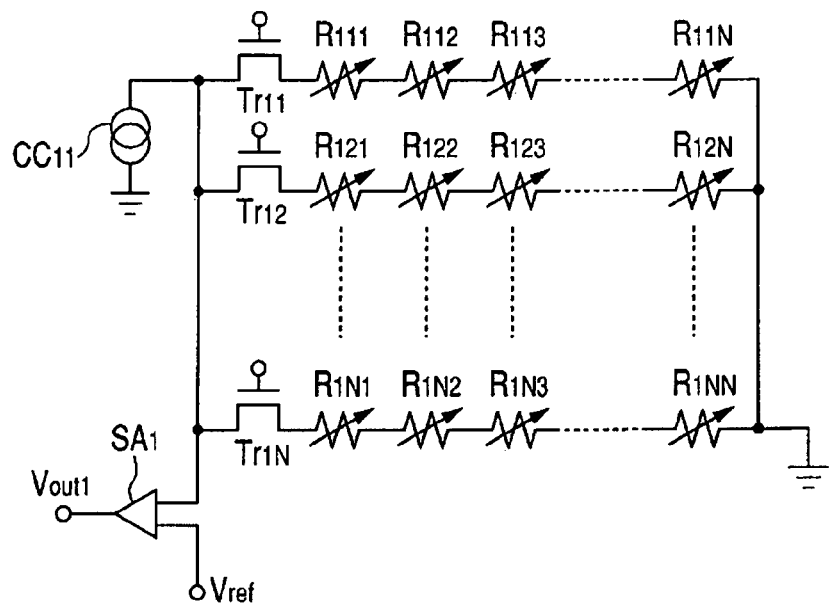
FIG. 1 is a circuit diagram of a magnetic sensor of the present invention.

The accompanying drawings, which are incorporated in and constitute a part of the specification, illustrate embodiments of the invention and, together with the description, serve to explain the principles of the invention.

BEST MODE FOR CARRYING OUT THE INVENTION

As explained above, a GMR film includes two magnetic films, one of which has a magnetizing direction easily following a direction of an external magnetic field, while the other of which has a fixed magnetizing direction. A magnetic film having a magnetizing direction easily following a direction of an external magnetic field can for example be NiFe, but because of a low change rate in the magnetic resistance, is often formed by NiFeCo or an exchange coupled film of NiFe and FeCo. In case of an exchange coup-lied film, a FeCo film inducing a large magnetic resistance change rate is so positioned as to be in contact with a non-magnetic material such as Cu, provided between two magnetic materials. The magnetic resistance change rate means a rate of resistance change when magnetizing directions of the two magnetic films shift from a parallel state to an antiparallel state. Thus a larger magnetic resistance change rate provides a larger detection signal.

The magnetoresistive film includes a TMR (tunneling magnetic resistance effect) film, in addition to the GMR film. A TMR film has a basic structure obtained by replacing the non-magnetic metal film in the GMR film with a thin dielectric film. A detection current is applied in a direction perpendicular to the surface of the TMR film, thereby causing a tunneling of electrons through the dielectric film. The TMR film has a larger magnetic resistance change rate and a higher resistance, in comparison with the GMR film. It is therefore scarcely influenced by the resistance of wirings and is suitable for a sensor utilizing a large-scale integrated circuit. The dielectric film to be used in the TMR film is usually constituted of $Al_2O_3$ or MgO.

The two magnetic films of the magnetoresistive film are influenced by a static magnetic coupling on the interface and have a tendency that the magnetizing directions do not easily become antiparallel. Therefore, in case the two magnetic films have little difference in the magnetization inverting magnetic fields, the magnetizations do not easily become antiparallel whereby a large change in the magnetic resistance cannot be obtained. Therefore, there is proposed a spin valve type magnetoresistive film in which the magnetic film with a fixed magnetizing direction is exchange coupled with an antiferromagnetic film thereby realizing an antiparallel state. The antiferromagnetic film is a magnetic material in which adjacent spins are directed mutually oppositely thereby showing no apparent magnetization and not causing an inversion of the direction of spin even under a strong magnetic field. Therefore, with an exchange coupling of the ferromagnetic film with such antiferromagnetic film, an inversion of magnetization of the ferromagnetic film is difficult as it also requires to invert the spins of the antiferromagnetic film.

A magnetic film of transition metals such as NiFe or FeCo, ordinarily employed in the magnetoresistive film, is a longitudinally magnetized film. A decrease in the size of the magnetic sensor causes an increase in the antimagnetic field, thereby resulting in an eddying magnetization or an increase in the coercive force thereby requiring a large magnetic field for the magnetic inversion. For avoiding such drawback, there is known a method of employing, for the magnetic film, a magnetic material which is easily magnetized perpendicularly to the film plane. Such material can be, for example, an alloy film or a multi-layered film of a rare earth metal and a transition metal, an artificial lattice film of a precious metal and a transition metal, a CoCr alloy film or a Ba ferrite alloy film.

FIG. 1 is a circuit diagram of a magnetic sensor of the present invention. A detecting part constituted of serially connected N magnetoresistive films $R_{111}$, $R_{112}$, $R_{113}$, ..., $R_{11N}$ is connected, at an end thereof, through a selecting transistor $Tr_{11}$ to an input terminal of a sensing amplifier $SA_1$ and also to a constant current source $CC_{11}$, and is grounded at the other end. Also similarly constructed plural detecting parts ($R_{121}$, $R_{122}$, $R_{123}$, ..., $R_{12N}$-$R_{1M1}$, $R_{1M2}$, $R_{1M3}$, ..., $R_{1MN}$) are connected in parallel through selecting transistors $Tr_{12}$-$Tr_{1N}$. The sensing amplifier $SA_1$ receives a reference voltage $V_{ref}$ and detects a number of magnetic particles from a comparison result $V_{OUT}$. Such an array of plural magnetoresistive films allows to detect the number of magnetic particles in a wide range.

The surface of the magnetoresistive film is subjected to a treatment for fixing magnetic particles, such as an Au film formation. By modifying the surface of the magnetic particle with thiol, a magnetic bead can be fixed on the surface of the magnetoresistive film by an Au-thiol coupling. By aligning the magnetization of the magnetic film of the magnetoresistive film in a direction and by aligning the magnetizing direction of the fixed magnetic beads for example by a magnetic field application, the magnetoresistive film on which the magnetic beads are fixed shows a higher resistance. An amount of increase in the resistance of the detecting part depends on the number of magnetic beads, and the number of the fixed magnetic beads can be detected by comparing the voltage of the detecting part with the reference voltage.

Figure 2:
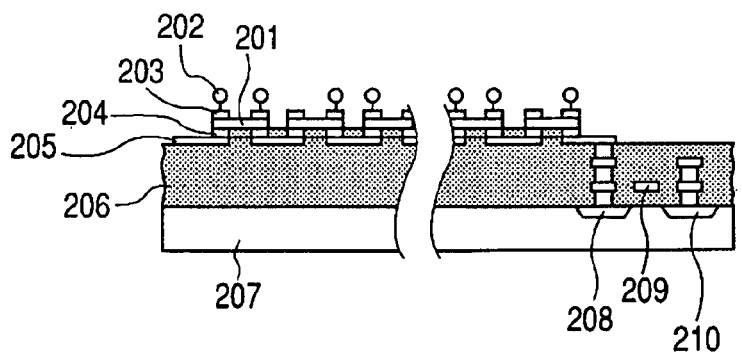
FIG. 2 is a schematic cross-sectional view of a detection part and a selecting transistor of the magnetic sensor of the present invention.
Figure 3:
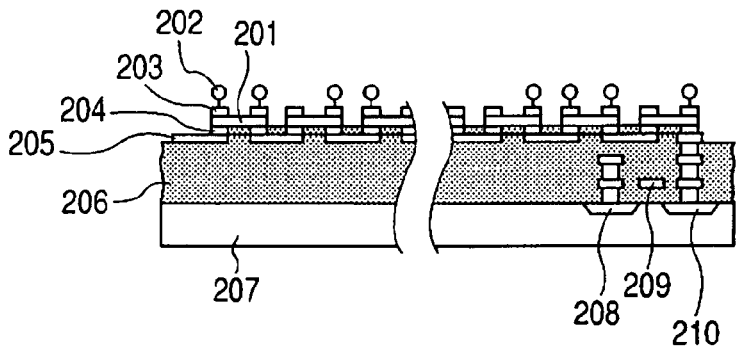
FIG. 3 is a schematic cross-sectional view of a detection part and a selecting transistor of the magnetic sensor of the present invention, in which the selecting transistor is formed under the detection part.

FIG. 2 is a schematic cross-sectional view of a magnetoresistive film of a selecting transistor of the magnetic sensor of the present invention. On a silicon substrate 207 and an insulation film 206 formed thereon, there is provided a selecting transistor having a source 208, a gate 209 and a drain 210. On the insulation film 206, serially connected plural magnetoresistive films 204 are provided, and, a magnetoresistive film 204 positioned at an end is connected, at a lower electrode 205 thereof, through a plug to the source 208 (or drain 210) of the selecting transistor. On an upper electrode 201 of the magnetoresistive film 204, a fixing film 203 is provided for fixing a magnetic particle 202. Also for reducing the entire area of the sensor, the selecting transistor may be superposed with the magnetoresistive film as shown in FIG. 3. Also, though not illustrated, the sensing amplifier and the constant current source may be monolithically formed on the semiconductor substrate. In this manner it is rendered possible to decrease the number of input/output terminals and to reduce the dimension of the entire sensor system.

Figure 4:
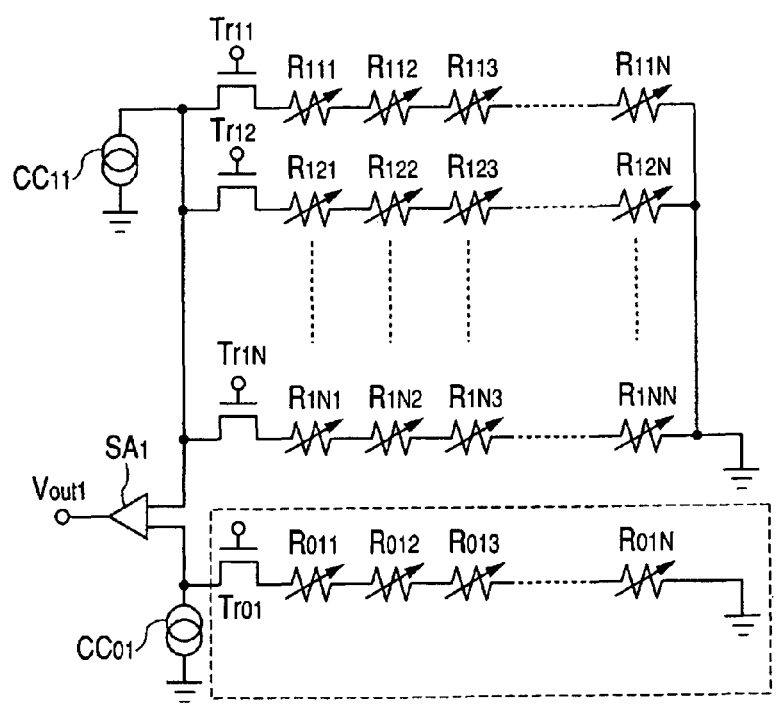
FIG. 4 is a circuit diagram of a magnetic sensor of the present invention, having a reference cell.

FIG. 4 is a circuit diagram showing a configuration of another embodiment of the magnetic sensor of the present invention. The present embodiment has a detecting part, constructed by magnetoresistive films $R_{111}$-$R_{11N}$, $R_{121}$-$R_{12N}$, ..., $R_{1N1}$-$R_{1NN}$, selecting transistors $Tr_{11}$-$Tr_{1N}$ and a constant current source $CC_{11}$ same as in the circuit shown in FIG. 1. The present embodiment includes, instead of the reference voltage $V_{ref}$ supplied to the sensing amplifier $SA_1$ in the circuit shown in FIG. 1, a reference voltage supply part containing, as reference resistor, magnetoresistive films $R_{011}$-$R_{01N}$ similar to those constituting the detecting circuit. The reference voltage supply part utilizes a voltage, obtained between a constant current source $CC_{01}$ and a ground potential, as a reference voltage, thereby improving the precision of detection. The reference resistances $R_{011}$-$R_{01N}$ are similar to the magnetoresistive films constituting the detection part but do not have magnetic particles fixed thereon. Such reference resistor allows, even in case the magnetoresistive films show a fluctuation in the resistance by an influence of the manufacturing process, to provide the sensing amplifier with an appropriate reference voltage.

The magnetic sensor of the present invention, being capable of precisely detecting magnetic particles from several particles to several tens of thousands, is suitable for use as a biosensor. A DNA hybridization or an antigen-antibody reaction can be utilized in such biosensor. An antigen constituting a target substance can be a biomolecule (protein, nucleic acid or saccharide), an allergen, bacteria or virus, but is not limited to such examples. An antibody capable of specifically recognizing such antigen may be fixed to the magnetoresistive film and the magnetic particle and may be used in an antigen-antibody reaction. As an example, a DNA probe in a single-chain state is fixed on the magnetoresistive film. Then a solution containing magnetic particles modified with a specimen DNA as the target substance is dropped on the detecting part, whereby the magnetic particles are fixed on the magnetoresistive film only when the DNA probe and the specimen DNA are coupled. The magnetic particles are measured after the unfixed magnetic particles are removed from the detection part for example by a rinsing. Presence of the magnetic particles confirms that the specimen DNA has a desired DNA sequence. In the foregoing, there has been explained a DNA detecting method, but an antigen detection can also be executed. On the magnetoresistive film, a primary antibody capable of specifically or selectively coupling with a desired antigen is fixed. Then a specimen solution is dropwise added onto the magnetoresistive film. If the specimen contains an antigen, the primary antibody and the antigen execute a specific coupling. The specimen on the detecting part is washed off to remove unnecessary substances. A secondary antibody capable of specifically or selectively coupling with the antigen is fixed on the magnetic particles to be used for detection, and a solution containing such magnetic particles is dropped onto the detecting part. Then the surface of the detecting part is rinsed to remove the magnetic particles that have not been coupled with the antigen. The antigen is indirectly detected by measuring the magnetic particles. In the foregoing there has been explained examples of reaction on the biosensor, but it is possible also to utilize a avidin-biotin reaction, an antigen-aptamer (RNA fragment having a specified structure) interaction, a ligand-receptor interaction, a DNA-protein (transfer factor etc.) interaction or a lectin-sugar chain interaction.

In the following, the present invention will be further clarified by examples.

Example 1

Figure 5:
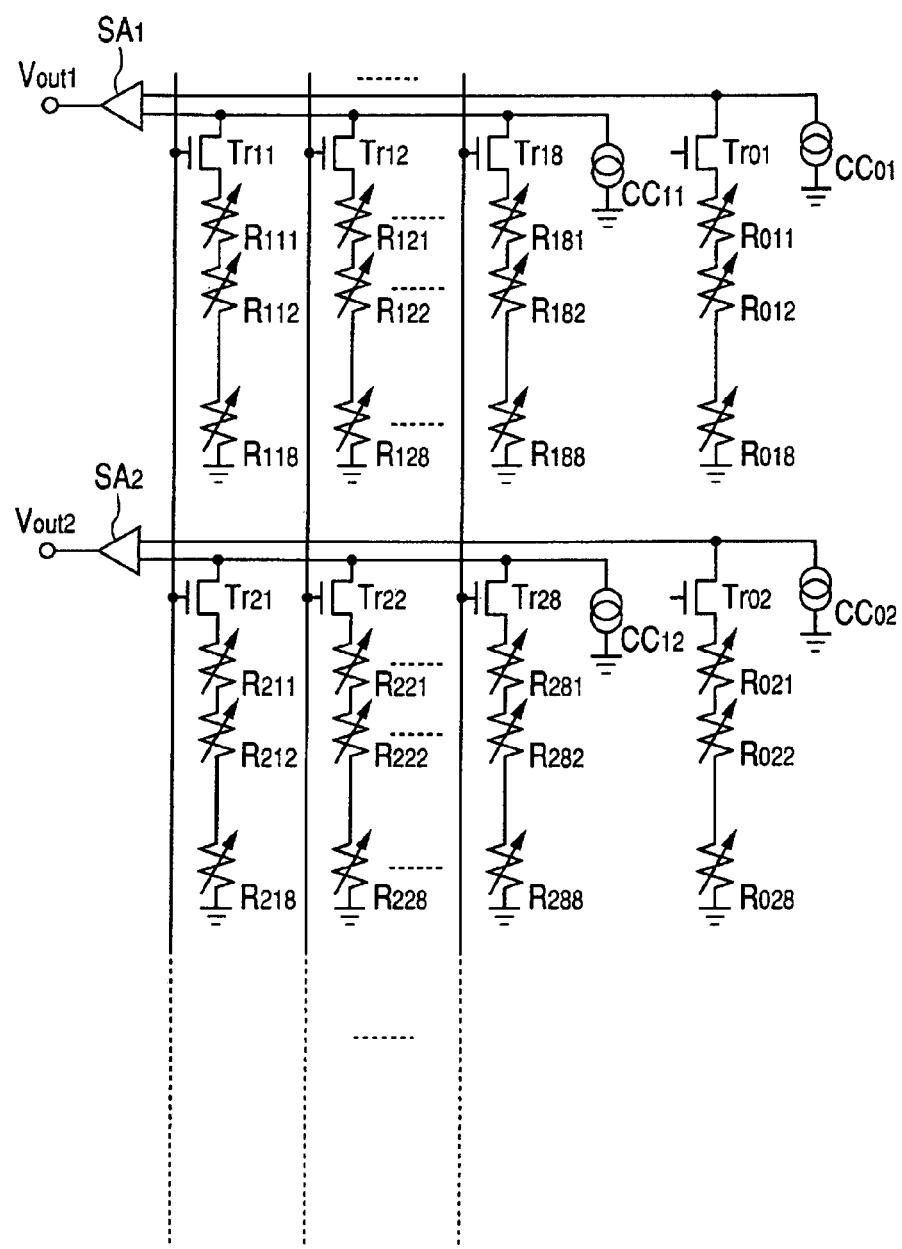
FIG. 5 is a circuit diagram of a magnetic sensor of an example 1 of the present invention.

FIG. 5 is a circuit diagram showing a structure of an examp0le of the magnetic sensor of the present invention. In the present example, eight magnetoresistive films $R_{111}$, $R_{112}$, ..., $R_{118}$ are serially connected to constitute a detecting part. An Au film is formed on the magnetoresistive films constituting the detecting part, thereby enabling fixation of magnetic particles. The detecting part is connected at an end thereof to a power source of a predetermined potential such as a ground potential, and, at the other end, through a selecting transistor $Tr_{11}$ to an input of a sensing amplifier $SA_1$ and a constant current source $CC_{11}$. Also eight magnetoresistive films $R_{121}$, $R_{122}$, ..., $R_{128}$ constituting another detecting part is connected at an end thereof to a ground potential, and, at the other end, through a selecting transistor $Tr_{12}$ to an input of a sensing amplifier $SA_1$. Magnetoresistive films $R_{131}$-$R_{188}$ are also similarly connected, whereby a voltage change in 64 magnetoresistive films is detected by $SA_1$.

Also eight magnetoresistive films $R_{011}$, $R_{012}$, ..., $R_{018}$ used as reference cells are serially connected, and are connected at an end thereof to a ground potential, and, at the other end, through a selecting transistor $Tr_{01}$ to the input of the sensing amplifier $SA_1$ and a constant current source $CC_{01}$. On these eight magnetoresistive films, a $SiO_2$ film is formed to inhibit fixation of the magnetic particles. A voltage obtained by the serially connected eight magnetoresistive films $R_{011}$, $R_{012}$, ..., $R_{018}$ and $Tr_{01}$ is used as a reference voltage.

Magnetoresistive films $R_{021}$-$R_{028}$ and $R_{211}$-$R_{288}$, selecting transistors $Tr_{21}$-$Tr_{28}$, constant current sources $CC_{12}$ and $CC_{02}$, and a sensing amplifier $SA_2$ are similarly connected. Though not illustrated in FIG. 5, 98 detecting circuits similar to that explained above are further prepared and connected. Therefore the magnetic sensor of the present example contains 6400 magnetoresistive films capable of fixing the magnetic particles. It is thus made possible to read the signals in parallel from the sensing amplifiers $SA_1$ and $SA_2$, thereby increasing the detecting speed.

The magnetoresistive film has a structure shown in FIG. 6. On a lower Pt electrode (not shown), there are laminated in succession a MnIr alloy film, a FeCo alloy film, an $Al_2O_3$ film, a FeCo alloy film, a NiFe alloy film, and a Pt film. The magnetoresistive film thus prepared is annealed at 150° C. in vacuum.

The annealing temperature may be such a temperature as to induce a one-dimensional anisotropy in the MnIr alloy film and not to destruct the selecting transistors or the $Al_2O_3$ film. At the vacuum annealing, a magnetic field is applied in a direction along a film plane. A magnitude of the magnetic field is so selected that the magnetization of the magnetic film is directed in the direction of the applied magnetic field under a temperature elevation, and is 500 Oe in the present example. The FeCo alloy film (pinned layer) in exchange coupling with the MnIr film has a magnetizing direction pinned in the direction of one-directional anisotropy of the MnIr alloy film, and the magnetization of the pinned layer is not easily inverted by a magnetic field in a direction opposite to the direction of the one-dimensional anisotropy. On the other hand, the magnetization of the change coupled film (free layer) of the NiFe alloy film and the FeCo alloy film can be easily aligned with the direction of the applied magnetic field. The magnetization of the magnetoresistive film is aligned, in an initial state, in the direction of the one-dimensional anisotropy of the MnIr alloy film. The Pt film formed on an outermost surface of the magnetoresistive film is a protective film for avoiding an erosion of the magnetoresistive film in a later step. Each magnetoresistive film has a rectangular shape of 2.3×0.8 μm, and the one-dimensional anisotropy of the MnIr alloy film is directed along the longitudinal direction thereof.

A magnetic particle to be detected in the present example is surfacially covered with $SiO_2$, and is reacted with mercaptosilanol in an acetic acid solution, thereby bonding an SH group. Thus, when a solution containing such magnetic particles is dropped onto the detecting part, the thiol group and the Au film on the magnetoresistive film are bonded thereby fixing the magnetic particle on the magnetoresistive film. The magnetic particle including the $SiO_2$ coating film has a diameter of about 400 nm, so that about 10 magnetic particles can be fixed at maximum on a magnetoresistive film, whereby the present example has a detection range from 1 to about 60,000 magnetic particles. A larger number of magnetic particles can be detected by increasing the number of the magnetoresistive films.

After the fixation of the magnetic particles, a magnetic field is applied in the direction of the one-dimensional anisotropy of the MnIr alloy film, thereby magnetizing the magnetic particles in the direction of the applied magnetic field. As shown in FIG. 9, a floating magnetic field is generated from the magnetic particles, and functions, to the magnetoresistive film, in a direction opposite to the applied magnetic field, namely to the initial magnetizing direction. Therefore, in a region where the floating magnetic field has a relatively strong function, the magnetization of the free layer of the magnetoresistive film is inclined from the initial direction. In this situation, the magnetization of the pinned layer, being pinned by the MnI alloy film, hardly changes from the initial state. Thus, while the magnetizing direction of the free layer and that of the pinned layer are mutually parallel in the initial state, the two magnetizing directions become different under the application of the floating magnetic field, whereby the magnetoresistive film shows a larger resistance. With fixation of a larger number of magnetic particles on the magnetoresistive film, the inclination of the magnetization of the free layer takes place in a wider area, whereby the magnetoresistive film shows an increasing resistance change according to the number of the magnetic particles.

The reference cell which is constituted of the magnetoresistive films $R_{011}$-$R_{018}$ and on which the magnetic beads are not fixed retains the initial resistance even when the magnetic particles are present in the specimen. It is therefore possible, by applying a same current to the detecting part and the reference cell, to detect the number of the magnetic particles by the sensing amplifier. Eight detecting parts connected to a sensing amplifier are so constructed that the selecting transistor supplies a current to only one detecting part and not to other detecting parts at the detection. Output signals are obtained from the eight detecting parts are obtained by switching the selecting transistor in succession. However, the reference cell is constantly given a current during the detection. Thus, the detection of the magnetic particles can be achieved electrically and can therefore be completed within an extremely short time.

Example 2

When the particle size of the magnetic particle becomes significantly smaller than the magnetoresistive film, the detection of a single magnetic particle becomes difficult as the area where the floating magnetic field is applied becomes smaller. It is therefore necessary to reduce the dimension of the magnetoresistive film in order to detect magnetic particles of a smaller particle size. However a longitudinally magnetized film, made smaller in dimension, increases the coercive force, whereby the magnetizing direction becomes difficult to change and the detection of the magnetic particles becomes difficult. For avoiding such drawback, there is known a method of utilizing a magnetic material which is easily magnetized perpendicularly to the plane of the magnetic film of the magnetoresistive film.

The present example shows an example of detecting magnetic-particles with a particle size as small as 50 nm. The magnetic particles to be detected have SH groups as in Example 1, and an Au film is formed on the magnetoresistive film. The sensor has a circuit structure same as that in Example 1. The magnetoresistive film is formed, as shown in FIG. 7, by laminating in succession a TbFeCo alloy film, a FeCo alloy film, an $Al_2O_3$ film, a FeCo film, a GdFeCo alloy film and a Pt film.

The TbFeCo alloy film is a vertical magnetization film showing a large coercive force in a composition close to the compensation composition. The TbFeCo film and the FeCo alloy film are exchange coupled, and the magnetization of the FeCo alloy film can be fixed in a desired direction. Thus a two-layered film formed by the TbFeCo film and the FeCo alloy film functions as a pinned layer. The GdFeCo alloy film and the FeCo alloy film adjacent thereto are exchange coupled and these two-layered films serve as a free layer. The magnetization of the FeCo alloy film is perpendicular to the film plane in a zero magnetic field, but is inclined under an application of a magnetic field opposite to the magnetizing direction. It is however so designed as not to show a rectangular magnetization curve but that a magnetic field where the magnetization starts to decrease is different from a magnetic field where the magnetization is saturated. The magnetoresistive film has a dimension of 180×180 nm and a single magnetoresistive film is capable of fixing about 10 magnetic particles.

In an initial state prior to detection, the magnetizations of the pinned layer and the free layer are aligned upwards from the film plane. After the magnetic particles are fixed on the magnetoresistive film, a magnetic field perpendicularly downwards to the surface of the magnetoresistive film is applied to the magnetic particles. In an area where the applied magnetic field and the floating magnetic field are both applied, because of the application of a relatively large magnetic field, the magnetization of the free layer of the magnetoresistive film becomes strongly inclined from the initial direction, but, in an area where the floating magnetic field is not applied, magnetization of the free layer shows little inclination because it only receives the external magnetic field. Thus, in the presence of the magnetic particles, the detecting part shows a voltage higher than that of the reference cell, and a voltage difference depends on the number of the magnetic particles.

The magnetic field applied at the detection may be applied longitudinally along the film plane. A magnetization applied along the film plane causes the magnetization of the free layer to be inclined from the direction perpendicular to the film plane. When the magnetic particles are fixed on the magnetoresistive film, a floating magnetic field from the magnetic particles is applied in a direction opposite to that of the external magnetic field, whereby the net magnetic field applied to the magnetoresistive film becomes smaller, whereby the magnetizing direction of the free layer shows a smaller change in comparison with a case where the magnetic particles are not fixed. In this case, therefore, the reference cell shows a voltage larger than that of the detecting part.

Example 3

The magnetic sensor of the present invention is also usable as a biosensor. The present example shows a biosensor for detecting a prostate specific antigen (PSA) known as a marker for a prostatic cancer.

The magnetoresistive film has a structure same as that of the magnetoresistive film in Example 1, but with a size of 1.3×0.5 μm. Also the magnetic particles have a particle size of about 250 nm.

In order to carry a primary antibody on the Au film formed on the magnetoresistive film, the surface of the Au film is treated with a piranha solution (sulfuric acid:hydrogen peroxide=3:1) and then treated with a 1 mM methanolic solution of 10-carboxy-1-decanethiol to form a self-assembled monolayer (SAM) presenting carboxyl groups on the surface. Then, for fixing the primary antibody, reaction with water-soluble carbodiimide (WSC) and N-hydroxysuccinimide (NHS) is executed to convert the carboxyl groups, on the Au film surface, to active ester groups. This conversion can be confirmed for example by attenuated total reflection (ATR) method. Then anti-PSA antibody is contacted to achieve fixation by a bonding of amino group of the antibody on the SAM. The fixation of the antibody can be confirmed by an ATR detection of the amide bonding derived from the antibody. After the fixation of the antibody, the Au film surface is treated with ethanolamine of a high concentration to block the unreacted active ester groups. In this manner, a detection sensor having the anti-PSA antibody fixed as the primary antibody can be obtained.

Thus obtained detection sensor can be used for detecting a prostate specific antigen (PSA), known as a marker for prostate cancer according to the following protocol:

(1) The detection sensor is immersed in a phosphate-buffered physiological saline solution (specimen solution) containing PSA as the antigen (specimen), and is incubated for 5 minutes;

(2) Unreacted PSA is washed off with a physiological saline solution;

(3) The detection sensor after the steps (1) and (2) is immersed in a phosphate-buffered physiological saline solution containing anti-PSA antibody (secondary antibody) marked with magnetic particles, and is incubated for 5 minutes;

(4) Unreacted marked antibody is washed off with a physiological saline solution.

Through this protocol, the secondary antibody 801, the antigen 803 and the primary antibody 804 are mutually bonded and the magnetic particle 802 is fixed on the Au film 805 constituting the magnetoresistive film, as shown in FIG. 8. As the magnetic particles are not fixed on the magnetoresistive film in case the antigen is absent in the specimen, it is possible to detect the antigen by detecting presence/absence of the magnetic particles. It is also possible to indirectly measure the amount of the antigen contained in the specimen, by detecting the number of the fixed magnetic particles.

INDUSTRIAL APPLICABILITY

The magnetic sensor of the present invention is capable, in detecting a number of small magnetic materials, of a detection over a wide range, and also of a detection within a short time, and can be employed as a sensor for detecting a biosubstance by a modification on the magnetic material.

This application claims priority from Japanese Patent Application No. 2005-023519 filed on Jan. 31, 2005, which is hereby incorporated by reference herein.

The invention claimed is:

1. A magnetic sensor comprising:
a plurality of detecting parts each having a plurality of magnetoresistive films electrically connected in series;
a plurality of selecting parts, each having a first end and a second end, wherein each of the plurality of selecting parts is arranged corresponding to each of the plurality of detecting parts, respectively, and wherein the first end of each of the plurality of selecting parts is electrically connected to an end of one of the detecting parts, respectively;
a reference part having a first constant current source and a plurality of magnetoresistive films electrically connected in series;
a reference part selecting device for selecting the reference part;
a second constant current source electrically and commonly connected to all of the second ends of the plurality of selecting parts; and
a sensing part for receiving a signal from one of the detecting parts and a signal from the reference part.

2. A magnetic sensor according to claim 1, wherein the plurality of selecting parts are selected in succession to serially outputting results of detection in each of the detecting parts.

3. A magnetic sensor according to claim 1, wherein
the sensing part is a plurality of sensing parts, and the plurality of the sensing parts output in parallel the results of detection in the detecting parts.

4. A magnetic sensor according to claim 1, wherein
at least one of the magnetoresistive films is a spin tunneling magnetoresistive film.

5. A magnetic sensor according to claim 1, wherein
a magnetic film constituting at least one of the magnetoresistive films has an easy direction of magnetization perpendicular to film plane.

6. A magnetic sensor according to claim 1, wherein
at least one of the selecting parts is a transistor provided on a semiconductor substrate, and at least one of the magnetoresistive films is provided so as to cover at least a part of the transistor.

7. A detection kit comprising a magnetic sensor according to claim 6, and a magnetic material bearing a substance capable of selectively bonding with a target substance.

8. A magnetic sensor according to claim 1, wherein a substance, on which a magnetic material to be detected directly or indirectly is fixed, is provided on the detecting part or in a proximity thereof.

9. A magnetic sensor according to claim 8, wherein
the sensing part includes an amplifier, and
the amplifier includes a first input node for receiving a signal from the detecting part and a second input node for receiving a reference voltage from the reference part, and the magnetic material is not fixed on the plural magnetoresistive films of the reference part.

10. A sensor including a magnetic sensor according to claim 1, and constructed to detect a target substance which functions to fix a magnetic material, to be detected by the magnetic sensor, to a desired position.

* * * * *